United States Patent [19]
Houdeau et al.

[11] Patent Number: 6,072,698
[45] Date of Patent: Jun. 6, 2000

[54] CHIP MODULE WITH HEAT INSULATION FOR INCORPORATION INTO A CHIP CARD

[75] Inventors: Detelf Houdeau, Regensburg; Josef Kirschbauer, Blaibach; Hans-Georg Mensch, Neunburg; Peter Stampka, Schwandorf-Klardorf; Hans-Hinnerk Steckhan, München, all of Germany

[73] Assignee: Siemens Aktiengesellschaft, Munich, Germany

[21] Appl. No.: 09/049,559

[22] Filed: Mar. 27, 1998

Related U.S. Application Data

[63] Continuation of application No. PCT/DE96/01725, Sep. 12, 1996.

[30] Foreign Application Priority Data

Sep. 27, 1995 [DE] Germany .......................... 195 35 989

[51] Int. Cl.⁷ .............................. H05K 1/14; G06K 19/06
[52] U.S. Cl. .......................... 361/737; 361/749; 361/760; 174/254; 235/492; 257/679
[58] Field of Search ................................. 361/737, 760, 361/749; 174/254, 261; 235/492; 257/679

[56] References Cited

U.S. PATENT DOCUMENTS

| | | | |
|---|---|---|---|
| 4,603,249 | 7/1986 | Hoppe et al. | 235/492 |
| 4,625,102 | 11/1986 | Rebjock et al. | 235/492 |
| 4,755,661 | 7/1988 | Ruebsam | 235/492 |
| 5,057,460 | 10/1991 | Rose | 437/217 |
| 5,079,673 | 1/1992 | Kodai et al. | 361/737 X |
| 5,147,982 | 9/1992 | Steffen | 361/406 X |
| 5,440,451 | 8/1995 | Saito et al. | 361/760 |

FOREIGN PATENT DOCUMENTS

| | | |
|---|---|---|
| 0 527 438 A2 | 2/1993 | European Pat. Off. . |
| 2 617 668 | 1/1989 | France . |
| 2 639 763 | 6/1990 | France . |
| 36 39 630 A1 | 6/1988 | Germany . |
| 42 32 625 A1 | 3/1994 | Germany . |
| 43 25 458 A1 | 2/1995 | Germany . |
| 43 25 712 A1 | 2/1995 | Germany . |
| 44 27 309 A1 | 2/1996 | Germany . |
| 44 43 767A1 | 6/1996 | Germany . |

OTHER PUBLICATIONS

"Rigid Dish Smart Card", IBM Technical Disclosure Bulletin, vol. 32, No. 4A, Sep. 1989.

Primary Examiner—Leo P. Picard
Assistant Examiner—Jayprakash N. Gandhi
Attorney, Agent, or Firm—Herbert L. Lerner; Laurence A. Greenberg; Werner H. Stemer

[57] ABSTRACT

A heat flow which is introduced into a chip module from the outside is specifically controlled to avoid delaminations between a covering composition and a chip during a hot-melt incorporation process. This takes place either by a heat-insulating layer which is interposed between a flexible carrier tape of the chip module and a chip adhesively fixed thereon, or by clearances within an area or layer of metal contacts. As a result, a heat flow from a hollow punch brought down in an outer region of the metal contacts, in the direction of the centrally mounted chip, is prevented.

4 Claims, 2 Drawing Sheets

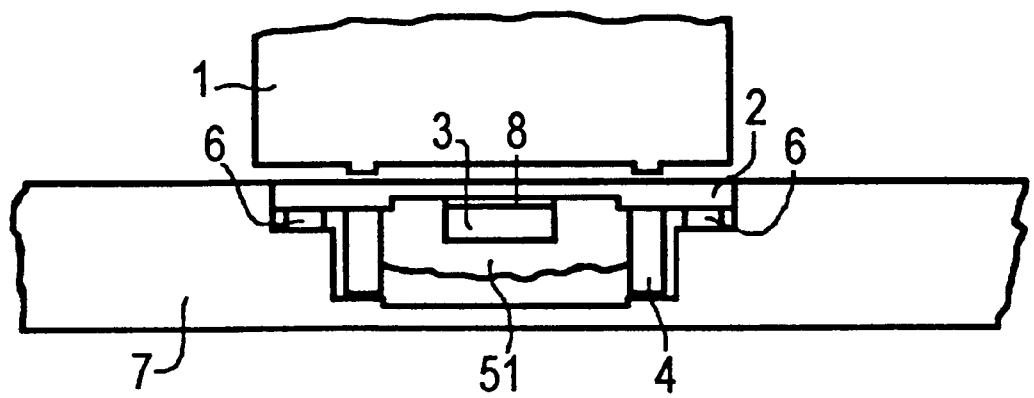
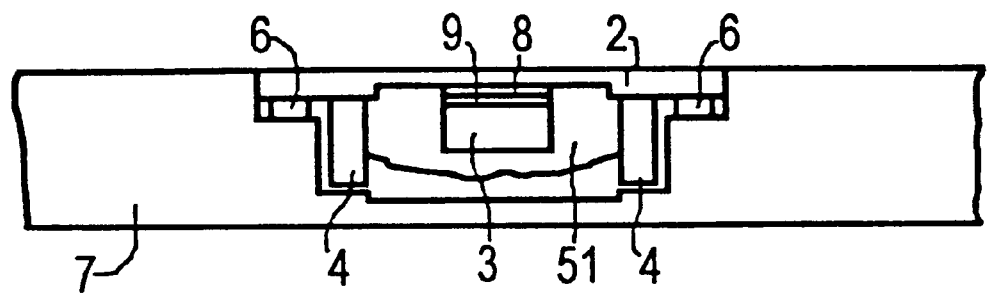

CHIP MODULE WITH HEAT INSULATION FOR INCORPORATION INTO A CHIP CARD

CROSS-REFERENCE TO RELATED APPLICATION

This application is a continuation of International Application PCT/DE96/01725, filed Sep. 12, 1996, which designated the United States.

BACKGROUND OF THE INVENTION

FIELD OF THE INVENTION

The invention relates to a chip module for incorporation into a basic card body of a chip card.

Chip cards are sufficiently known in the prior art. The application possibilities for chip cards are extremely varied and are still steadily increasing with the increasing computing power and storage capacity of the available integrated circuits contained therein. However, that entails an increase in the size of the integrated circuits to be incorporated (electronic components, chips).

The structure of a chip card is determined by many characteristics, some of which are prescribed by corresponding standards. That relates, for example, to the resistance of the card with respect to UV radiation and X-radiation, the mechanical load-bearing strength of the card body and of the electrical contacts, and the temperature resistance.

In most production processes for chip cards, the chip is first of all mounted onto a flexible film. The necessary card contacts are on this film. The individual chip modules are then punched out from the ready-mounted film. In that case, the chips are attached indirectly in the card through the carrier of the module. That has the advantage of keeping flexural forces away from the chip. In that case the chip is mounted with its rear side on the flexible film. The electrical terminal areas located on its front side are connected through bonding wires to bonding assemblies, which are connected through the flexible film to the card contacts. The front side of the chip, including the wires, is generally protected by a covering, for example a plastic composition, against corrosive influences. The configurations referred to above are parts of customary processes for the packing of chips in standard packages.

According to the current state of the art, chip modules for chip cards with contacts are mounted according to three basic technologies:

a) cyanoacrylate adhering technique;

b) hot-melt adhering technique; and c) contact-adhesive adhering technique.

The technique referred to under c) is also referred to as pressure-sensitive adhesion. In that case, the shear stress produced by a mechanical pressure in the adhesive layer leads to a reduction in the viscosity of the adhesive which establishes or improves the physical contact with the connecting element, for example a basic card body. An example of a single-layer hot-melt adhering technique is provided by German Published, Non-Prosecuted Patent Application DE 36 39 630 A1. An example of a multi-layered cyanoacrylate adhering technique is provided by European Patent Application 0 527 438 A2.

The durability of a chip card is decisively determined in particular by the quality of the bond between the chip module and the card body. If, for example, a chip module is inserted into a recess milled into a card body and is adhesively fixed there, that may entail a significant temperature loading if, for example, a hot-melt adhesive is used.

A chip module is understood to mean a chip carrier which has eight contacts on the contact side. A semiconductor chip which is placed on the opposite side is located between those contacts of the chip card, i.e. it lies directly opposite, as seen laterally. Such chip modules are known from U.S. Pat. No. 4,625,102 and French Patent Application 2 617 668. While the cyanoacrylate adhering technique and the contact-adhesive adhering technique make do with low process temperatures for module mounting, a significant defining feature of the hot-melt adhering technique is the comparatively high incorporation temperature. Customary temperatures lie in the range from 200 to 250°. A great amount of heat is introduced into the chip module in that method during the module implantation, which lasts less than 1.5 seconds. That heats up not only the adhesive layer which bonds the chip module to the basic card body, but also the chip carrier element, the semiconductor chip and the covering composition. In that case, it must be taken into consideration at the same time that the structure of a chip module includes a plurality of component parts of different materials. For example, according to U.S. Pat. No. 4,625,102 the flexible film, which is the carrier, may be formed of an epoxy resin. The contacts applied thereto on one side are formed of a metal, the semiconductor chip is formed of a crystal, for example silicon, the bonding wires are formed of metal and the covering composition provided for the front side of the chip is formed of a plastic. If that system is subjected to a major temperature fluctuation, the consequence may be so-called delaminations, i.e. separations between adjacent layers. In the case of a chip module of the type referred to, the bond, generally an adhesive bond, between chip and the carrier, is uncritical. However, brief heating up of the overall system leads to local defects in the covering composition, which are referred to as delamination, after lengthy storing and transporting times of the modules. Delaminations between the chip and the covering composition may lead to malfunctions or to the failure of the chip module. The reason therefor is that a delamination in that area causes a tearing off of electrical conductors, namely the bonding wires by which the chip is connected to the outer contacts. The above-mentioned hot-melt method of adhesively fixing a chip module into a card body entails a correspondingly high thermal loading of the chip module.

The covering compositions curing under ultraviolet light, are particularly susceptible with respect to delamination. The cause thereof are thermally induced stresses in the overall system of the chip module. Those stresses exist because of dilathermal mismatches between the semiconductor chip, the chip carrier element and the covering composition. The relevant coefficients of thermal expansion in the same temperature ranges are in the ratio 2.5:10:18. The probability of delaminations occurring increases with an increase in the size of the semiconductor chip and with an increase in the transporting and storing time. In that time, the covering composition absorbs moisture from the ambient air and that moisture leads to a material expansion, which is also referred to as swelling. The swelling of the covering composition and the brief pronounced heating up of the module when it is incorporated into the basic card body are responsible for high reject rates after incorporation. That is the case in particular with chip modules which have a chip with a large surface area. Such chips are referred to as microcontrollers and/or cryptocontrollers.

Previous measures for eliminating disadvantages from the prior art included the development, selection and trial testing of covering compositions which have a low absorption of moisture, and measures which lead to an increase in the adhesion of the covering composition, such as, for example, greater roughness of the chip carrier surface. For example, covering compositions which are provided with adhesion promoters (silane/siloxane-based) have thus been used.

SUMMARY OF THE INVENTION

It is accordingly an object of the invention to provide a chip module for incorporation in chip cards, which overcomes the hereinafore-mentioned disadvantages of the heretofore-known devices of this general type and with which delamination between a covering composition and an electronic component, with resultant functional loss of the chip module, in a bonding process between the chip module and the card body, is prevented.

With the foregoing and other objects in view there is provided, in accordance with the invention, a chip module for incorporation in a basic card body of a chip card, comprising a flexible carrier tape having good heat conductivity, two opposite sides and a predetermined area for bonding the chip module to a basic card body; flat-area metal contacts applied to one of the sides of the carrier tape; at least one electronic component applied to the other of the sides of the carrier tape and electrically connected to the contacts; and a heat-insulating layer disposed between the at least one electronic component and the carrier tape.

In accordance with another feature of the invention, the heat-insulating layer is formed of polyimide and has a thickness of 10 $\mu$m.

With the objects of the invention in view there is also provided a chip module for incorporation in a basic card body of a chip card, comprising a flexible carrier tape having two opposite sides and a predetermined area for connecting the chip module to a basic card body; flat-area metal contacts having contact surfaces and an outer region, the metal contacts applied to one of the sides of the carrier tape and disposed in two parallel rows defining a metal surface between the rows, the metal surface having an outer region, and one of the contact surfaces formed in one piece with the metal surface; at least one centrally mounted electronic component applied to the other of the sides of the carrier tape and electrically connected to the metal contacts; and the metal surface having clearances extended perpendicular to the rows of the metal contacts, for preventing a heat flow from a hollow punch brought down annularly in the outer region of the metal contacts and the metal surface in the direction of the electronic component.

In order to incorporate a chip module into the card body of a chip card, a certain amount of heat has to be introduced from the outside in various processes. This takes place with external heat, which is generated, for example, in a punch and is transferred into the chip module by bringing the punch down onto it. The introduction of heat has the aim of increasing the temperature at the locations or areas at which, for instance, an adhesive bond is to be established between the carrier of the chip module and the card body. Conduction of heat into other regions of the chip module should be minimized. However, since a heat emitting hollow punch comes down on the contacts disposed on the flexible film and the amount of heat is introduced into the chip module through these contacts in producing an adhesive bond, it is not possible to prevent significant conduction of heat in the direction of the chip. Since the thermal conductivity of the covering composition that is likewise in contact with the flexible carrier film is low, a significant amount of the energy which is introduced passes from the flexible carrier film through an adhesive layer into the chip. This leads not only to heating up of the chip, but also to delamination in the contact region between the chip and the covering composition.

In order to prevent this, a heat-insulating layer is introduced between the adhesive layer and chip. A further way in which the object is achieved provides selectively placed clearances in the metallic contacts onto which a hollow punch for the introduction of heat comes down. If the use of a heat-insulating layer between the chip and the adhesive layer which bonds the chip to the module prevents the conduction of heat within the module in the direction of the chip, clearances in the metallic contacts prevent the lateral conduction of heat, i.e. in the surface area of the metal contacts. Since the hollow punch is brought down in an approximately annular form on the metallic contacts in the outer region of the chip module, and the chip on the opposite side of the carrier of the chip module is disposed approximately concentrically with respect to the metallic contacts, it also lies in the inner region, as viewed in relation to the hollow punch. Taking this as a basis, it is evident that a flow of heat directed perpendicularly through the module having a flat-area construction is desired for producing a hot-melt adhesive bond. The clearances within the metallic contacts are placed in such a way that a conduction of heat within the electrical contacts which is directed inwardly and parallel to the chip module having a flat-area construction is prevented by the clearances which are made. As a result, heating through of the chip module during the brief hotmelt incorporation time is prevented by structural measures.

The layer of metallic contacts, which has the best thermal conductivity, is consequently partially interrupted in the corresponding direction. The epoxy/glass-fiber composite layer which is present on the inner side of a chip module has a thermal conductivity which is less by orders of magnitude, for which reason this layer is of no significance with regard to the objective referred to above. The clearances are generally slots, in order to constitute a correspondingly wide heat barrier within the outline of a hollow punch.

Other features which are considered as characteristic for the invention are set forth in the appended claims.

Although the invention is illustrated and described herein as embodied in a chip module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic, sectional view showing a relevant positioning of a hollow punch when incorporating a chip module into a card body;

FIG. 2 is a view similar to FIG. 1 with an additional heat-insulating layer between a flexible carrier film and a chip;

DESCRIPTION OF THE PREFERRED EMBODIMENTS

Figure 3:
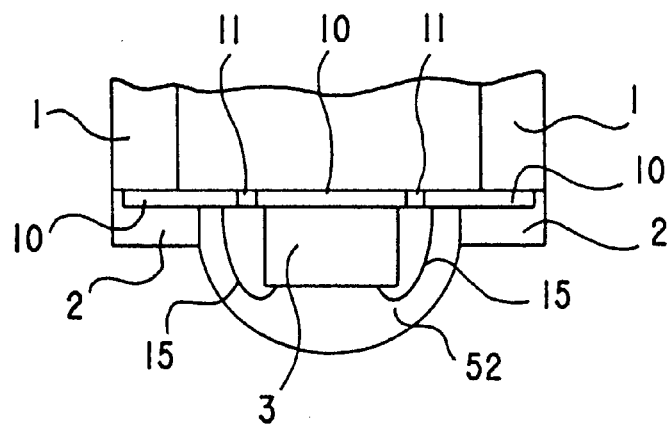
FIG. 3 is a fragmentary, sectional view of a chip module, in which clearances are present within a layer of metal contacts.

The invention makes it possible to avoid delamination of a covering composition in a chip area during a hot-melt incorporation process when incorporating modules with a gold island into card bodies.

Referring now to the figures of the drawings in detail and first, particularly, to FIG. 1 thereof, there is seen a chip module which is adhesively fixed onto a card body 7 through the use of a hollow punch 1 at a relatively high temperature of, for example, 200° C., under the effect of force with corresponding time control, in a hot-melt module-incorporating method. In this case, FIG. 1 specifically shows that the hollow punch 1 is brought down on a flexible carrier tape 2 of the chip module. Since outwardly visible metal contacts are positioned at that location, the hollow punch 1 is set down onto them. The chip module has an adhesive layer 8 toward the inside, through the use of which a chip 3 is positioned and fixed on the carrier tape 2. A reinforcing frame 4 is likewise disposed on the carrier tape 2 and surrounds the chip 3. A covering composition 51 protects the chip 3 and its electrical connections, which are routed to the contacts, against corrosion and mechanical influence from outside. The chip module is adhesively fixed into the card body 7 through the use of hot-melt adhesive 6.

In the embodiment of FIG. 1 it is possible for a significant amount of heat to flow from the hollow punch 1 through the carrier tape 2 and the adhesive 8 directly into the chip 3. In order to exclude that possibility in the representation of FIG. 2, which corresponds to FIG. 1, a heat-insulating layer 9 has additionally been introduced. That layer prevents the different thermal coefficients of expansion of the chip (for example silicon), the covering composition and the flexible carrier tape from coming into effect and causing damage by strong thermomechanical forces at a high temperature. Those forces occur if high temperatures are introduced into the overall system, for example during the incorporation process of the chip module. That may lead to delaminations. In that case the covering composition may detach itself from the chip and cause functional failures of the module, for example by damaging the electrical conductors between the chip and external contacts.

The delamination effects can be eliminated by applying a polyimide layer to the rear side of the chip. Polyimide has a low thermal conductance, meaning that polyimide can be used as a heat barrier. As a result, thermomechanical forces between the chip 3 and the covering composition 51 can be reduced. In the meantime, the heat of the heating punch 1 which is necessary for the adhesion will flow into the hot-melt adhesive 6, in order to produce the bond. The polyimide is applied to the rear side of the wafer in the wafer process. The thermal conductivity of polyimide is so low that even a layer thickness of only 10 $\mu$m of polyimide is sufficient, as preliminary tests have shown.

Due to the material characteristic value for thermal conductivity, the heat-insulating layer 9 is preferably a polyimide layer. However, the use of other heat insulators is equally possible. Since the polyimide can be applied to the rear side of the wafer in a simple way in the wafer process, the selection of this material is very advantageous.

FIG. 3 represents a chip module together with a hollow punch 1 resting thereon. The carrier tape 2 has metal contacts 10 on one side and the chip 3 disposed opposite and approximately concentrically thereto. A covering composition 52 protects an active side of the chip 3, as well as its bonding 15 with the metal contacts 10. It can be clearly seen that through the use of clearances 11, a lateral heat flow which would be directed sideways in the figure from the hollow punch 1 in the direction of the chip, is prevented. A heat flow directed from top to bottom in section, from the hollow punch 1 through the metal contacts 10 and through the carrier tape 2, is not hindered.

Figure 4:
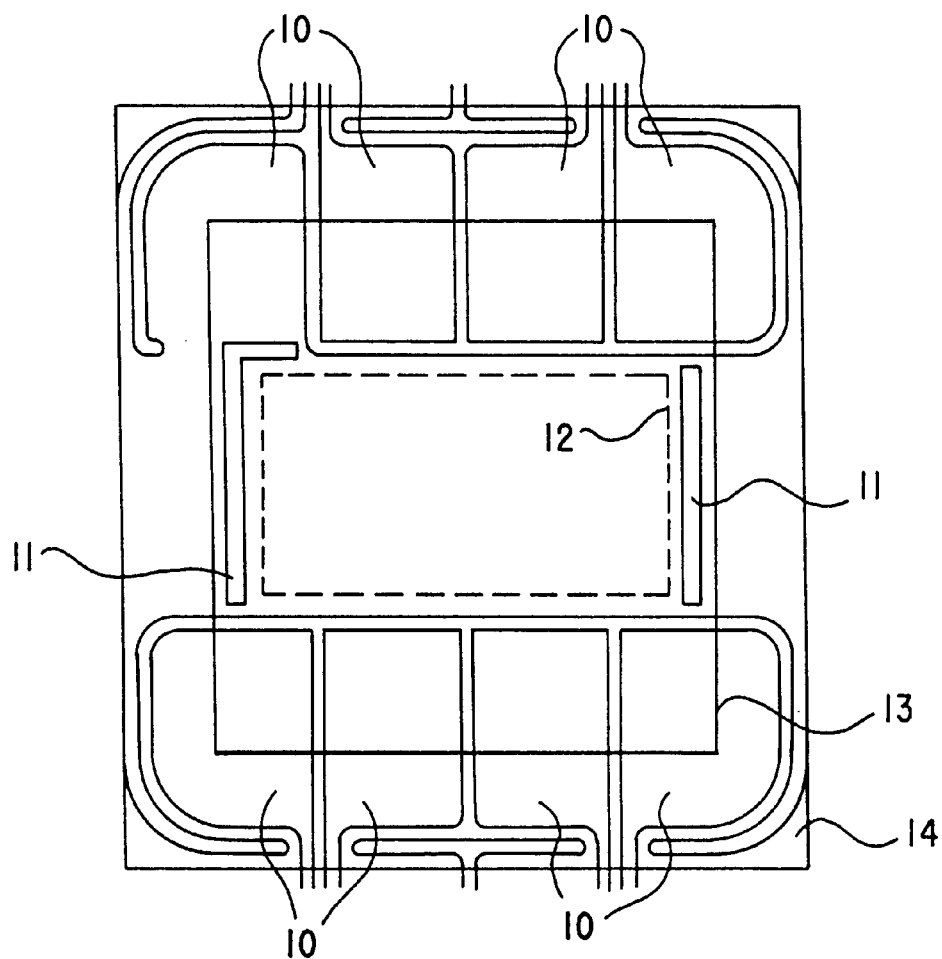
FIG. 4 is a plan view showing the metal contacts, the clearances and an outline of the chip.

The currently customary contacts of a chip card are represented in FIG. 4. The metal contacts 10 are disposed substantially in two rows which are opposite in relation to the chip 3. A chip outline 12 indicates a central position of the chip 3. An inner outline 13 of the hollow punch 1 and an outer outline 14 of the hollow punch 1 form rectangles lying concentrically one within the other. The clearances 11, which are formed as slots, prevent a heat flow inwardly, i.e. in the direction of the chip 3 that is mounted opposite the clearance 11, at those locations at which interruptions for delimiting the individual metal contacts 10 are not provided anyway in the metal layer.

The invention can be applied both to modules with a gold island and to other modules which do not have such a gold island.

We claim:

1. A chip module for incorporation in a basic card body of a chip card, comprising:

a flexible carrier tape having good heat conductivity, two opposite sides and a predetermined area for bonding the chip module to a basic card body;

flat-area metal contacts applied to one of said sides of said carrier tape;

at least one electronic component applied to the other of said sides of said carrier tape and electrically connected to said contacts; and a heat-insulating layer disposed between said at least one electronic component and said carrier tape.

2. The chip module according to claim 1, wherein said heat-insulating layer is formed of polyimide.

3. The chip module according to claim 2, wherein said polyimide layer has a thickness of 10 $\mu$m.

4. A chip module for incorporation in a basic card body of a chip card, comprising:

a flexible carrier tape having two opposite sides and a predetermined area for connecting the chip module to a basic card body;

flat-area metal contacts having contact surfaces and an outer region, said metal contacts applied to one of said sides of said carrier tape and disposed in two parallel rows defining a metal surface between said rows, said metal surface having an outer region, and one of said contact surfaces formed in one piece with said metal surface;

at least one centrally mounted electronic component applied to the other of said sides of said carrier tape and electrically connected to said metal contacts; and said metal surface having clearances extended perpendicular to said rows of said metal contacts, for preventing a heat flow from a hollow punch brought down annularly in said outer region of said metal contacts and said metal surface in the direction of said electronic component.

* * * * *